United States Patent
Wagener et al.

[19]

[11] Patent Number: 5,942,037
[45] Date of Patent: Aug. 24, 1999

[54] ROTATABLE AND TRANSLATABLE SPRAY NOZZLE

[75] Inventors: Thomas J. Wagener, Shorewood; Kevin L. Siefering, Chaska; Pamela A. Kunkel, Cologne; James F. Weygand, Excelsion; Gregory P. Thomes, Chaska, all of Minn.

[73] Assignee: FSI International, Inc., Chaska, Mich.

[21] Appl. No.: 08/773,489

[22] Filed: Dec. 23, 1996

[51] Int. Cl.⁶ .................................................... B05B 7/06
[52] U.S. Cl. ........................ 118/315; 451/421; 451/193; 134/177
[58] Field of Search .................................. 118/315, 308, 118/323; 134/177, 175; 239/548, 550, 566, 568; 451/421, 193, 120

[56] References Cited

U.S. PATENT DOCUMENTS

| | | |
|---|---|---|
| 4,027,686 | 6/1977 | Shortes et al. . |
| 4,030,615 | 6/1977 | Guggi et al. . |
| 4,038,786 | 8/1977 | Fong . |
| 4,655,847 | 4/1987 | Ichinoseki et al. . |
| 4,747,421 | 5/1988 | Hayashi . |
| 4,806,171 | 2/1989 | Whitlock et al. . |
| 4,857,113 | 8/1989 | Hodge . |
| 4,909,181 | 3/1990 | Smith ...................................... 118/315 |
| 4,936,922 | 6/1990 | Cherry . |
| 5,062,898 | 11/1991 | McDermott et al. . |
| 5,108,512 | 4/1992 | Goffnett et al. . |
| 5,125,979 | 6/1992 | Swain et al. . |
| 5,129,956 | 7/1992 | Pickering et al. . |
| 5,195,548 | 3/1993 | Roger . |
| 5,209,028 | 5/1993 | McDermott et al. ...................... 51/426 |
| 5,294,261 | 3/1994 | McDermott et al. ........................ 134/7 |
| 5,364,474 | 11/1994 | Williford, Jr. .............................. 134/32 |
| 5,366,156 | 11/1994 | Bauer et al. .............................. 239/135 |
| 5,372,652 | 12/1994 | Srikrishnan et al. ........................ 134/7 |
| 5,377,911 | 1/1995 | Bauer et al. .............................. 239/135 |
| 5,378,312 | 1/1995 | Gifford et al. . |
| 5,456,758 | 10/1995 | Menon . |
| 5,486,132 | 1/1996 | Cavaliere et al. ......................... 451/75 |
| 5,512,106 | 4/1996 | Tamai et al. ................................ 134/7 |

FOREIGN PATENT DOCUMENTS

| | | |
|---|---|---|
| 0 633 443 A1 | 11/1995 | European Pat. Off. . |
| 01053543 | 3/1989 | Japan . |
| 02254141 | 10/1990 | Japan . |
| 03016666 | 1/1991 | Japan . |
| 642605 | 9/1950 | United Kingdom . |

*Primary Examiner*—David A. Simmons
*Assistant Examiner*—Calvin Padgett
*Attorney, Agent, or Firm*—Faegre & Benson, LLP

[57] ABSTRACT

A nozzle having a series of orifices along a longitudinal length of the nozzle for processing a substrate and which is rotatably adjustable. By the nozzle design of the present invention, liquid is properly distributed along the longitudinal length of the nozzle independently of the angle of the aerosol spray. This allows for the generation of a uniform aerosol stream that is independent of spray angle. The nozzle design of the present invention improves the uniform distribution of liquid within the nozzle, which in addition to providing a more uniform liquid pooling, also substantially eliminates temporal non-uniformities across the nozzle length. Moreover, the present invention is also directed to a nozzle that is translatable in the direction toward or away from the substrate to be processed or parallel to the substrate surface. The nozzle includes a series of impingement orifices provided in a longitudinal direction along at least a part of the nozzle, wherein the nozzle has an interior longitudinally divided into first and second internal cavities with plural openings between the first and second internal cavities, and the openings between the first and second cavities are oriented at a different radial angle from the longitudinal axis than the radial angle of the impingement orifices. Preferably, the nozzle comprises an inner tube and an outer tube operatively supported and connected with respect to one another. The present invention is also directed to the combination of such a nozzle that is rotationally and translatably adjustable independently from one another.

37 Claims, 5 Drawing Sheets

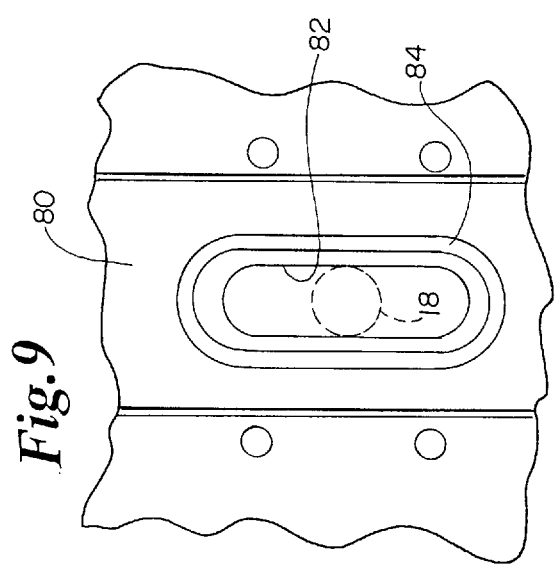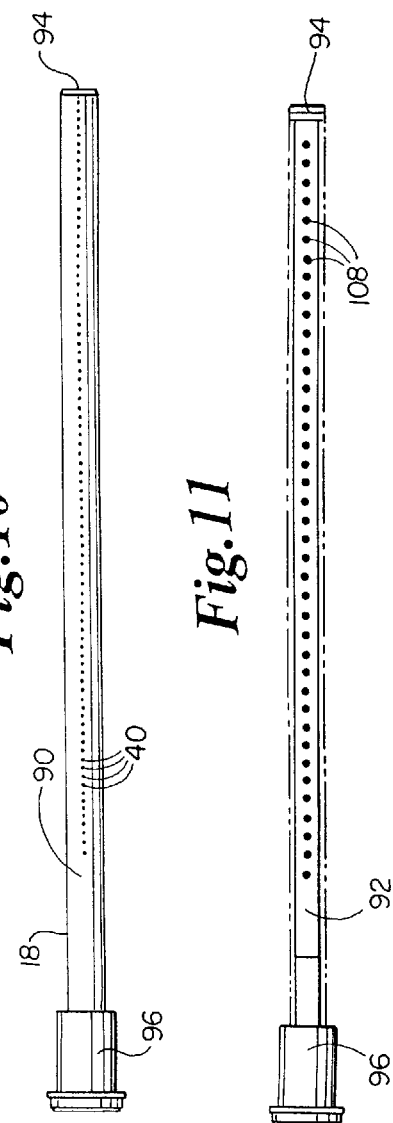

5,942,037

ROTATABLE AND TRANSLATABLE SPRAY NOZZLE

FIELD OF THE INVENTION

The present invention is directed to a nozzle of the type having a series of orifices extending in a longitudinal direction of the nozzle to provide an aerosol spray for processing a solid surface provided within a processing chamber. More specifically, the present invention is directed to a nozzle design wherein a uniform distribution of liquid is provided along the nozzle length for even aerosol spraying. The nozzle design also provides for a uniform distribution regardless of the angle so that the nozzle can be rotatable relative to the surface to be processed and translatable for varying the distance of the nozzle from the surface to be processed.

BACKGROUND OF THE INVENTION

The present invention has been developed for its particular applicability to the semi-conductor and micro-electronics industries, and in particular to the cleaning of contaminated substrates, including, for example, semi-conductor wafers of silicon and of gallium arsenide, multiple chip carriers, flat panel displays, magnetic hard disks, MEMs and other electronic devices. Many methods have been developed to clean such surfaces. Techniques include the use of solvents or chemical cleaning for removing contaminant films from surfaces, the use of high energy sonic waves, and combinations thereof Solvents for chemicals may be applied as gas jets or liquid spray.

More recently, cryogenic aerosols have been developed for jet spraying against surfaces, particularly within the semi-conductor wafer industry for particulate decontamination. Cryogens that have been used for removing the particulate contamination include argon, carbon dioxide and water. The idea behind cryogenic aerosols is to provide a jet of frozen crystals traveling at subsonic or supersonic speeds. The formation and size of the crystals depends on the thermal dynamic conditions including the pressure, temperature, flow and the crystal forming technique which depends largely on the initial phase of the supplied substance and the nozzle design. Carbon dioxide and water have been used in certain applications; however, silicon wafer cleaning requires high purity and the ability not to damage the surface of the silicon wafer. Thus, argon aerosol now seems particularly useful for semi-conductor wafer cleaning. For example, U.S. Pat. Nos. 5,377,911 to Bauer et al, 5,062,898, 5,209,028, 5,294,261, to McDermott et al disclose the use of cryogenic aerosols which may include argon combined with nitrogen. U.S. Pat. Nos. 4,747,421 to Hayashi and 4,806,171 to Whitlock et al describe apparatuses for cleaning substrates using carbon dioxide aerosol crystals.

A simple schematic of the cryogenic aerosol cleaning system is illustrated in FIG. 1, including a silicon wafer surface 1 and a jet impingement nozzle 2. Nozzle 2 includes a plurality of orifices along its length from which the aerosol jet spray is propelled toward the silicon wafer surface 1. Typically, the orifices are configured so that the aerosol jet stream impinges the silicon wafer 1 at a predetermined angle. The aerosol contains aerosol crystals 3 which are suspended within the aerosol gas illustrated by the lines extending from the nozzle to cross the silicon wafer surface 1 and from the silicon wafer surface 1 at the arrowheads. Contamination particles 4 are illustrated on the silicon wafer surface 1 and are also shown being carried away from the aerosol gas jet stream from the silicon wafer surface 1.

Typically, the jet impingement nozzle 2 is fixed in position and at a specific angle so that the aerosol jet stream including the aerosol crystals 3 impinge the silicon wafer surface 1 which is supported to be movable relative to the fixed position of the jet impingement nozzle 2. Usually, the silicon wafer having the surface 1 is mounted in a manner so that it can translate below the jet impingement nozzle 2 so that the entire silicon wafer surface 1 can be cleaned. Aerosol crystals 3 carried in the aerosol gas impinge the surface of the silicon wafer 1, cause the removal of contaminate particles 4, and the jet stream carries the contaminate particles 4 away from the silicon wafer surface 1. As described above, the aerosol may comprise cryogenic aerosol clusters as the aerosol crystals 3 or any of the other particles or liquids known for cleaning.

In a cryogenic cleaning apparatus, the nozzle 2 and silicon wafer, which would be supported by a movable chuck, are provided within an aerosol cleaning chamber. The aerosol cleaning chamber is provided in vacuum during the cleaning process in a manner to control formation of cryogenic aerosol crystals 3. More specifically, the inert substance, such as an argon and nitrogen mixture, is supplied to the nozzle 2 and is expelled from the jet impingement nozzle 2 into the vacuum cleaning chamber within which the cryogenic aerosol crystals 3 and aerosol gas jet stream are formed.

The cryogenic aerosol crystals 3 are primarily formed by evaporative cooling. Evaporative cooling relies on small liquid droplets that freeze prior to impinging the silicon wafer surface 1. The small liquid droplets are formed from larger droplets that are atomized by the high pressure gas that expands from the nozzle orifices. The small liquid droplets (the aerosol spray) freeze into crystals due to the pressure drop between the nozzle and the silicon wafer. Crystals formed by evaporative cooling are generally of about one to ten microns ($1–10\mu$) or larger in diameter. Less significantly, cryogenic aerosol crystals are also formed via Joules Thompson cooling, which is homogeneous nucleation of crystals based upon the temperature drop associated with the expansion within the aerosol cleaning chamber, as described in the above-noted Bauer U.S. Pat. No. 5,377,911. This nucleation provides much smaller and less effective crystals generally in the order of $0.01\mu$ in diameter.

Thus, in order to achieve the primary formation of the crystals by the atomization of liquid droplets into small liquid droplets and the subsequent freezing, the nozzle design must distribute the liquid uniformly along the length of the nozzle. Uniform distribution ensures the formation of the larger droplets along the length of the nozzle to be atomized, frozen, and carried by the aerosol gas.

As shown in FIGS. 2 and 3, a jet impingement nozzle 2 is shown at a fixed angular orientation. The inert substances provided within the interior of the nozzle 2, and the liquid forms a pool therein substantially to the level of the line of orifices. The aerosol spray is expelled from the orifices as noted above. It is important to provide a uniform spray along the longitudinal length of the nozzle for uniform processing. As shown in FIG. 3, the liquid pool extends along the portion of the longitudinal length that is illustrated. It is believed that waves move through the liquid pool, as also indicated in FIG. 3. These waves are believed to cause what has sometimes been observed as a wavering effect of the intensity of the aerosol spray along the length of the nozzle. This effect is referred to as a "walking" effect. Although the instantaneous uniformity of the nozzle is poor when walking is observed, this phenomenon does not significantly effect the uniformity of the processing since the waves move back and forth along the longitudinal length of the nozzle.

A consequence, however, of providing a fixed nozzle is the creation of a specific impingement angle. When cleaning or otherwise treating a substrate surface having surface features, patterns or vias, the aerosol stream at the set impingement angle may not adequately clean surfaces of the features. For example, the cleaning of contaminants from deep trenches and other surface features may be more thoroughly accomplished by orienting the aerosol spray direction nearly perpendicular to the substrate surface, while cleaning debris from a flat surface might require orientation of the aerosol spray at a very shallow grazing angle to the substrate surface. Furthermore, even with flat surfaces, different angles of impingement may be more effective because of the shape of the contaminant particles and the way that they are adhered to the flat surfaces.

In FIG. 4, a similar nozzle as that described above is illustrated but which is fixed in an orientation to provide a substantially perpendicular aerosol spray directed at a substrate surface. Specifically, the aerosol spray direction is illustrated in the direction of gravity. In this situation, the liquid pooling effect, discussed above, and thus the formation of cryogenic aerosol crystals is compromised. The liquid pooling is non-uniform and may even decrease to nothing, as illustrated on the right side, regardless of whether the cryogenic fluid is delivered at one or both ends of the nozzle or at any point along its length. With non-uniform liquid pooling, formation of cryogenic aerosol crystals at certain locations along the nozzle length can be inhibited and non-uniform processing can occur.

The aforementioned Bauer et al U.S. Pat. No. 5,377,911 discloses a fixed nozzle utilizing a dual chamber. As shown in FIG. 7A of the Bauer et al patent, an upper chamber connects with a lower chamber through a series of orifices, and another series of orifices are provided from the lower chamber from which the aerosol is expelled. However, the purpose of providing the upper and lower manifolds is to eliminate the generation of low pressure points and even distribution of gas passed from the upper distribution manifold to the lower distribution manifold.

SUMMARY OF THE PRESENT INVENTION

The present invention overcomes the disadvantages and shortcomings of the prior art by providing a nozzle having a series of orifices along a longitudinal length of the nozzle for processing a substrate and which is rotatably adjustable. By the nozzle design of the present invention, liquid is properly distributed along the longitudinal length of the nozzle independently of the angle of the aerosol spray. This allows for the generation of a uniform aerosol stream that is independent of spray angle. The nozzle design of the present invention improves the uniform distribution of liquid within the nozzle, which in addition to providing a more uniform liquid pooling, also substantially eliminates the walking effect.

The rotatable adjustment of the nozzle is advantageous in that the nozzle is useful in a wider range of applications. Specifically, the processing of substrates may be more thoroughly accomplished by orienting the aerosol spray direction differently depending on the surface features, type and shape of the particle contaminants and other factors. For example, where surface features are provided, an impingement angle of nearly perpendicular to the substrate surface may be preferred. For processing a very flat surface, a very shallow grazing impingement angle to the substrate surface may be preferred. However, higher efficiencies may be obtained by varying the impingement angles depending on, for example, contaminant particle shape and its adherence. The angular orientation of the aerosol spray is adjusted by rotating the nozzle. In the case of a cryogenic cleaning apparatus, it is a further advantage that the rotation can be accomplished while the process chamber remains under vacuum. Moreover, the rotation motion can be automated so that it can be altered automatically from substrate to substrate or during the cleaning of a single substrate.

Moreover, the present invention is also directed to a nozzle that is translatable in the direction toward or away from the substrate to be processed or parallel to the substrate surface. Thus, the distance between the nozzle and the substrate surface can be adjusted to optimize the process, or the nozzle can be translated while the substrate is fixed. Thus, with substrates of varying thicknesses, it is advantageously possible to manipulate the spray nozzle to maintain a fixed spray travel distance to the substrate surface over the variable thickness substrate surface.

The above advantages of the present invention are achieved by a nozzle for use in an apparatus for the treatment of a surface of an object by impinging the surface with an aerosol spray, the nozzle having a series of impingement orifices provided in a longitudinal direction along at least a part of the nozzle, wherein the nozzle has an interior longitudinally divided into first and second internal cavities with plural openings between the first and second internal cavities, and the openings between the first and second cavities are oriented at a different radial angle from the longitudinal axis than the radial angle of the impingement orifices. Preferably, the nozzle comprises an inner tube and an outer tube operatively supported and connected with respect to one another, the first internal cavity is provided between an inner surface of the outer tube and an outer surface of the inner tube, the second internal cavity is provided within the inner tube, and the openings extend through the inner tube. More preferably, the inner tube and the outer tube are circular in cross-section and are concentrically arranged. By this construction, the nozzle can be rotationally adjustably mounting to a wall of the aerosol chamber so that the series of impingement orifices can be set at different radial angles with respect to a longitudinal axis of the nozzle. The outer tube can also be advantageously adjustably provided with respect to the inner tube so as to optimize the particular radial offset for specific applications.

The present invention is also directed to the combination of such a nozzle with an apparatus for treating the surface of an object by impinging the surface with an aerosol spray, the apparatus having an aerosol chamber defining an interior space for receiving the object to be treated within the aerosol chamber; and a supporting means for operatively supporting the object within the aerosol chamber with a surface thereof in a position for treatment. The nozzle being rotationally adjustably supported within the aerosol chamber so that the series of impingement orifices can be set at different radial angles with respect to a longitudinal axis of the nozzle, and wherein the nozzle has an interior longitudinally divided into first and second internal cavities with plural openings between the first and second internal cavities, the openings between the first and second cavities being oriented at a different radial angle from the longitudinal axis than the radial angle of the impingement orifices.

In accordance with another aspect of the present invention, an apparatus is provided for treating the surface of an object by impinging the surface with an aerosol spray, the apparatus comprising an aerosol chamber defining an interior space for receiving the object to be treated within the aerosol chamber, a supporting means for operatively supporting the object within the aerosol chamber with a surface thereof in a position for treatment, and a nozzle having a series of impingement orifices provided in a longitudinal direction along at least a part of the nozzle, the nozzle being adjustably mounted within the aerosol chamber so that a distance between the nozzle and a surface of an object to be treated when supported in position by the supporting means can be varied. Preferably, the adjustable mounting is provided by a mounting plate to which the nozzle is mounted and which is adjustably mounted to a wall of the aerosol chamber for varying the distance between the nozzle and a surface of an object to be treated when supported in position by the supporting means. The nozzle extends through a slot provided through the wall of the aerosol chamber so that the nozzle can be adjusted in position along the length of the slot by changing the position of the mounting plate relative to the wall of the aerosol chamber. A sealing means can also be provided extending around the slot so that in any adjusted position of the nozzle, a sealing engagement can be provided between the mounting plate and the wall of the aerosol chamber.

The present invention is also directed to the combination of a nozzle that is both rotationally adjustable and translatably adjustable, each independently of the other.

BRIEF DESCRIPTION OF THE DRAWINGS

FIG. 9 is partial side view of the sidewall of an aerosol chamber to which the rotation and translational connection assembly of FIGS. 7 and 8 is to be mounted;

FIG. 10 is a side view of a nozzle in accordance with the present invention illustrating a series of longitudinally aligned orifices along the length of the outer tube of the nozzle;

FIG. 11 is a side view of the nozzle in accordance with the present invention that is rotated by 90 degrees radially from that shown is FIG. 10 with the outer tube removed and its position illustrated by the chain lines, the inner tube shown with a series of longitudinally aligned orifices;

FIG. 12 is a partial cross-sectional view of the nozzle of the present invention illustrating the inner and outer tubes connected together;

FIG. 13 is a schematic side view of a longitudinal portion of a nozzle in accordance with the present invention with the inner orifices oriented in the direction of gravity while the jet impingement orifices are directed at 90° relative to the inner orifices;

FIG. 14 is a cross-sectional view taken along line 14—14 of FIG. 13;

FIG. 15 is a schematic view similar to FIG. 13 but showing the inner orifices directed at 90° from the direction of gravity while the jet impingement orifices are directed in the direction of gravity; and FIG. 16 is a cross-sectional view taken along line 16—16 in FIG. 15.

THE DETAILED DESCRIPTION OF THE PREFERRED EMBODIMENTS

With reference to the Figures, and initially to FIG. 5, wherein like numerals represent like components throughout the several Figures, an apparatus 10 is illustrated for the treatment of the surface of an object, such as a silicon wafer 12. The present invention is useful for treating any type of microelectronics device, including but not limited to flat panel displays, hard drives, and multiple chip modules. Additionally, the invention is useful for treating masks used for microlithography processes including x-ray masks, and any semiconductor substrates including but not limited to gallium arsenide wafers or wafers comprised of silicon.

Apparatus 10 basically comprises a movable chuck 14 which supports the silicon wafer 12 within an aerosol chamber 16 and a jet impingement nozzle 18. The nozzle 18 is rotatably adjustable and translatable in accordance with the preferred embodiments of the present invention, as more fully described below. The apparatus 10 is used for treating a surface 13 of the substrate, e.g. silicon wafer 12; such treatment can be any coating, cleaning, or the like treatment wherein the jet impingement nozzle 18 provides an aerosol, liquid or gas to impinge surface 13. For the purposes of a specific description, the apparatus 10 will be described as an aerosol cleaning apparatus used for cleaning contaminants from the surface of a silicon wafer.

The illustrated chuck 14 is of the type exhibiting a linear movement within a predetermined range to move the entire side of the wafer 12 through the jet impingement stream. The present invention is also applicable to systems utilizing rotational chucks (not shown) whereby rotary movement of the wafer 12 is produced in order to impinge its surface with the jets from the nozzle 18. Alternatively, in accordance with one embodiment of the present invention, the nozzle may be translatable in the direction parallel to the surface of the wafer in addition to movement of the chuck or instead of to the chuck while the chuck and the wafer remain stationary to accomplish a similar result. The term chuck is used to mean a device which functionally supports the object to be treated. In the case where the chuck moves linearly or rotationally, the chuck also includes the appropriate slide or guide mechanism or turntable. However, where the chuck is stationary, it may be merely a functional support mechanism.

The present invention is particularly applicable for use as a cryogenic aerosol cleaning chamber used for cleaning contaminants from silicon wafers. As set forth above in the Background section, cryogenic cleaning may use argon aerosols, carbon dioxide, or water, for example. At present, argon aerosols are preferred. Specific examples of argon cryogenic aerosols combined with nitrogen are disclosed in U.S. Pat. Nos. 5,062,898, 5,209,028 and 5,294,261, all to McDermott et al, and U.S. Pat. No. 5,377,911 to Bauer et al, the entire disclosures of each of which are hereby incorporated by reference.

As shown in FIG. 5, the aerosol chamber 16 defines an enclosed interior space having an exhaust duct 20. Within the aerosol chamber 16, the movable chuck 14 is provided. The movable chuck 14 includes a surface for supporting a silicon wafer 12 thereon and is movably supported so that the surface 13 of the silicon wafer 12 to be treated can be completely moved through the impingement area of the jet impingement nozzle 18. Movable chuck 14 may include any conventional mechanism for securing the silicon wafer 12 to its surface facing jet impingement nozzle 18, such as by vacuum openings that open to the supporting surface for holding the silicon wafer 12 against it. Mechanical fasteners or clips, suction devices, electrostatic devices and electromagnetic devices are known for fastening the wafer to the chuck. These and others may be utilized. The movable chuck 14 is further supported within the aerosol chamber 16 to provide its necessary movement. Conventional slides and guiding mechanisms can be utilized to define the path of movement of the movable chuck 14. Moreover, an actuating mechanism 22 may be utilized to impart the movement to the movable chuck 14 along its guidepath. Actuator mechanism 22 may comprise any conventional electric, mechanical, electro-mechanical, hydraulic, pneumatic, or the like actuator mechanism. The actuator mechanism 22 should have a range of motion sufficient that the surface 13 of silicon wafer 12 can be moved entirely through the impingement area. An actuator rod 24 may be connected between the actuator mechanism 22 and the movable chuck 14, and may also include a vacuum passage for providing the vacuum to the surface of the movable chuck 14 for securing the silicon wafer 12, as discussed above.

Figure 1:
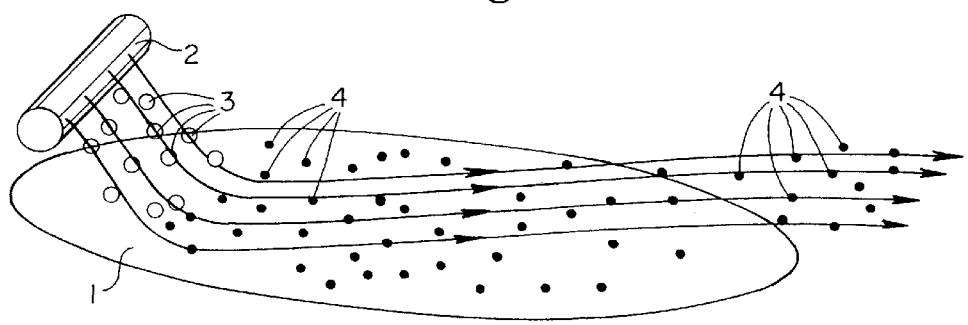
FIG. 1 is a schematic view of a typical cryogenic aerosol cleaning system for cleaning the surface of a silicon wafer.
Figure 2:
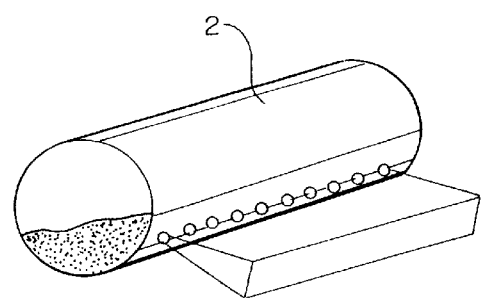
FIG. 2 is a schematic view in perspective of a nozzle having a series of longitudinally aligned orifices and oriented at an aerosol spray angle of about 45° from gravity.

To control the fluid dynamics within the aerosol chamber 16, a flow separator comprising a baffle plate 34 is connected to an end of the movable chuck 14 and to extend into the exhaust duct 20. Additionally, a shroud 36 is provided within the aerosol chamber 16 and comprises a plate connected to the aerosol chamber 16, such as its upper wall, for controlling flow around the nozzle 18. The controlling of the fluid dynamics within the aerosol chamber 16 by the baffle plate 34 and the shroud 36 are more fully described in copending U.S. application Ser. No. 08/712,342, filed Sep. 11, 1996. The basic purpose is to divide the post-impingement flow into positive streams C and D for preventing recontamination.

Nozzle 18 is supported within the aerosol chamber 16 to be rotatably adjustable as indicated by arrow A and to be translatable along the direction of arrow B to adjust the spacing between nozzle 18 and the surface 13 of the wafer 12. The manner of providing the rotatable and translatable adjustments are described below. Nozzle 18 is connected with a supply line 26, which itself may be further connected with discreet supply lines 28 and 30 connected with the actual gas or liquid supplies of argon, nitrogen, or the like, depending on the specific process. Further processing steps, such as gas cooling, may take place within the supply line 26, again depending on the specific process, so that the nozzle 18 expels the desired aerosol, such as a cryogenic cleaning aerosol. The inside of the aerosol chamber 16 may be further connected with either a vacuum device or a pressurizing device for selectively controlling the desired air pressure within the aerosol chamber 16 based upon the specific process. A vacuum device (not shown) may be connected through the exhaust duct 20. Pressure may be increased simply by providing gas through the nozzle 18 or by way of another supply line. For example, in a cryogenic cleaning apparatus using argon and nitrogen it is normally desirable to reduce the pressure within the aerosol chamber 16 for forming the cryogenic crystals. As described above in the background section, the cryogenic crystals are primarily formed by evaporative cooling which relies on the freezing of small liquid droplets prior to impinging the surface 13 of the wafer 12. The small liquid droplets are formed from larger droplets that are atomized by the high pressure gas that expands from the nozzle orifices. The small liquid droplets (the aerosol spray) freeze due to the pressure drop between the nozzle and the pressure within the aerosol chamber 16.

Figure 5:
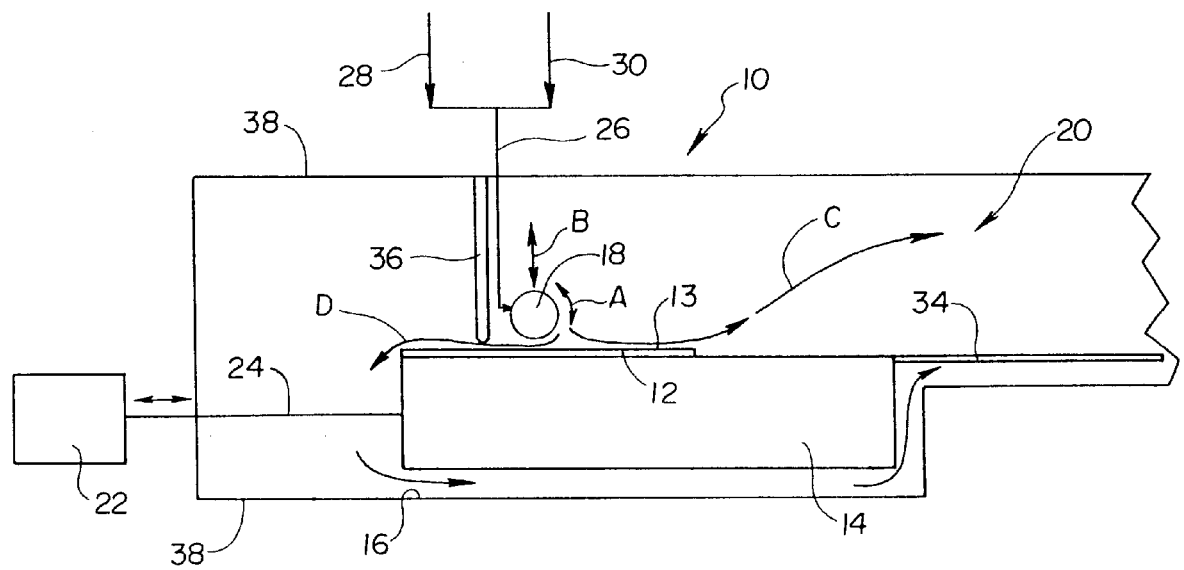
FIG. 5 is a side schematic view of an aerosol chamber including a nozzle that is rotatably adjustable and wherein the distance between the nozzle and the substrate surface is adjustable.

Also shown in FIG. 5, a make-up gas, preferably an inert gas such as nitrogen, can be introduced into the aerosol chamber 16 at one or more locations indicated by way of supply conduits 38. Although not necessary, such make-up gas is preferably introduced at the top and/or bottom of the aerosol chamber 16 the other side thereof away from the exhaust. The reason for the use of the make-up gas is to compensate or make-up for slight pressure deviations (in the order of between about 5–10 percent) within the aerosol chamber caused by instabilities in the nozzle and pressure controls. By supplying the make-up gas, the defect of any local pressure differentials is minimized and the positive overall pressure flow from the left to the right that is generated by the action of the impingement jets, as illustrated in FIG. 5, is maintained. The make-up gas can be introduced into the aerosol chamber 16 through slots provided through the top and bottom walls of the aerosol chamber 16. Conventional gas supply techniques can be used.

Figure 6:
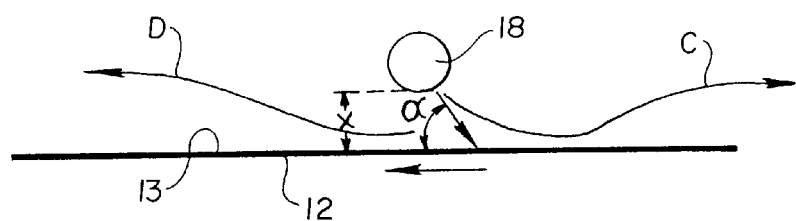
FIG. 6 is a schematic side view of a substrate moving toward the left relative to a nozzle in accordance with the present invention and showing the angle of impingement of the jet stream and the spray distance between the nozzle and the substrate surface.

It has been shown in FIG. 10, nozzle 18 includes a series of longitudinally aligned jet impingement orifices 40. With reference to FIG. 6, the jet impingement orifices 40 define the angle of impingement of the substance that is used to treat the surface 13 of the wafer 12. In the case of a cryogenic cleaning apparatus, the substance preferably comprises the frozen cryogenic crystals and gas stream. The angle of impingement is shown in FIG. 6 as angle $\alpha$. In accordance with the present invention, the nozzle 18 is rotatably mounted within the aerosol chamber 16 so that the angle a can be varied depending on the desired cleaning angle. Thus, the nozzle is useful or more efficient in a wider range of applications. Specifically, the processing of substrates including deep trenches and other surface features may be more thoroughly accomplished by orienting the aerosol spray direction nearly perpendicular to the substrate surface where $\alpha$ is 90°. For processing a very flat surface, the aerosol spray may be provided at a very shallow grazing angle that is close to an angle $\alpha$ of 0°. Other surfaces may require $\alpha$ angles anywhere between 0° and 90°. FIG. 6 shows the wafer 12 moving to the left. If, however, the wafer is moved to the right, the angle of impingement could similarly be adjusted between $\alpha$ angles of 90° through 180°. Depending on the surface features of the substrate, e.g. wafer 12, the angle $\alpha$ may be altered from substrate to substrate or during the cleaning of a single substrate.

Preferably, the nozzle 18 of the present invention is also adjustable toward or away from the surface 13. The distance x between the lower edge of the nozzle and the substrate surface can be adjusted to optimize any specific process. Moreover, with substrates of varying thicknesses, it is possible to manipulate the spray nozzle 18 to maintain a fixed spray travel distance x to the substrate surface over the variable thickness substrate surface.

Figure 7:
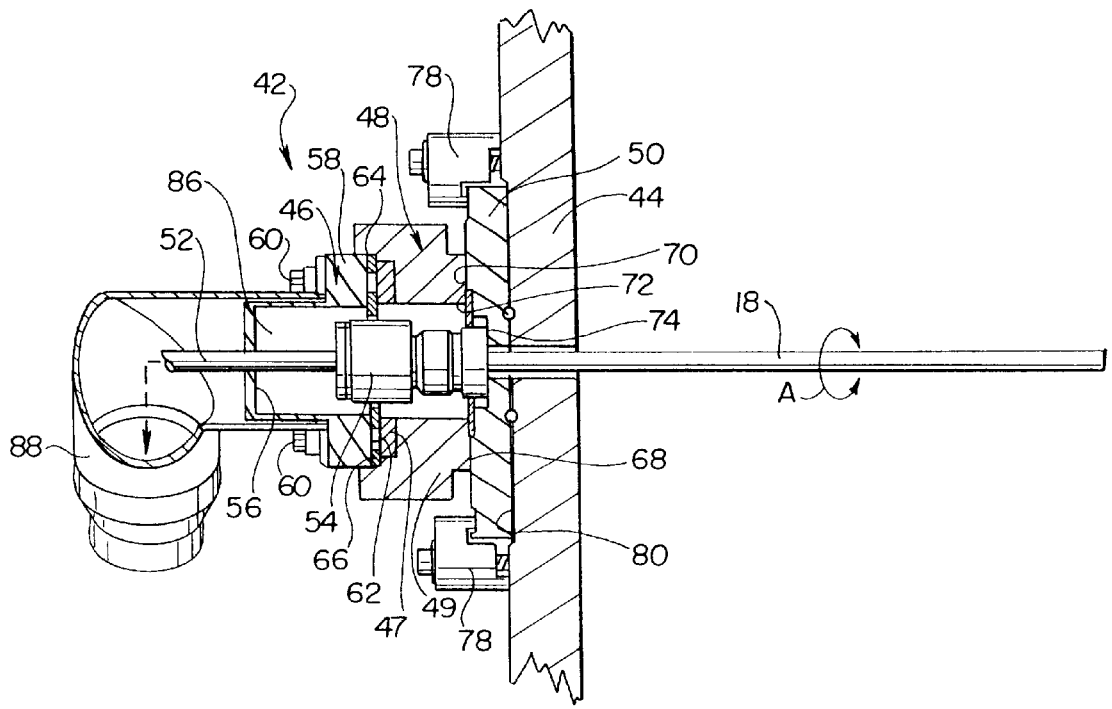
FIG. 7 is a partial cross-sectional view of a rotational and translatable connection assembly for a nozzle in accordance with the present invention shown mounted to a sidewall of an aerosol chamber.
Figure 8:
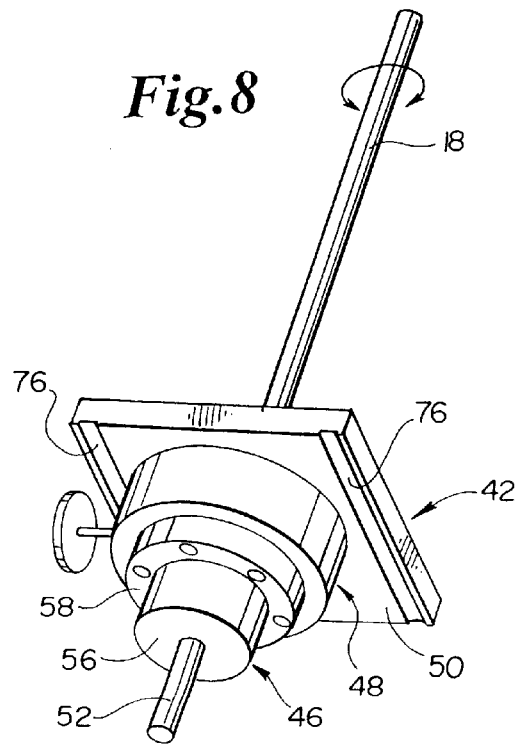
FIG. 8 is a perspective view of the rotational and translational connection assembly of FIG. 7 separated from its connection to the sidewall of the aerosol chamber.

Referring now to FIGS. 7, 8 and 9, a manner of rotatably and translatably mounting the nozzle 18 will be described. In FIG. 8, a rotational and translational connection assembly 42 is illustrated connected with nozzle 18. In FIG. 7, a partial cross-section through the rotational and translational connection assembly 42 is shown with the connection assembly 42 secured to a sidewall 44 which is a sidewall of the aerosol chamber 16. FIG. 9 shows a cutaway portion of the sidewall 44 to which the connection assembly 42 is to be mounted.

The rotational and translational connection assembly 42 comprises a cryogenic liquid vacuum feed through 46, a rotary feed through 48 and a mounting plate 50. In the assembled state shown in FIG. 7, the mounting plate 50 lies against the sidewall 44 of the aerosol chamber 16, and the rotary feed through 48 is provided between the mounting plate 50 and the cryogenic liquid vacuum feed through 46.

Nozzle 18 is illustrated connected with a supply tube 52 by a conventionally known VCR type fitting 54. Alternately, the nozzle 18 could be directly welded to the supply tube 52. Supply tube 52 passes through an opening provided through an end wall 56 of the cryogenic liquid vacuum feed through 46. The supply tube 52 is preferably sealingly connected to the endwall 56 to provide a vacuum seal and to facilitate nozzle adjustment, described below. More preferably, the supply tube 52 is welded to the endwall 56.

The cryogenic liquid vacuum feed through 46 preferably comprises a commercially available vacuum feed through available from Huntington Mechanical Laboratories, Inc. of Mountain View, Calif., as model FT-188. The cryogenic liquid vacuum feed through 46 also includes a flange portion 58 used for connecting the cryogenic liquid vacuum feed through 46 to the rotary feed through 48. As shown, bolts 60 are used. The flange portion 58 includes a surface 62 that is suitable for providing a vacuum seal with a recessed surface 64 of the rotary feed through 48. A seal or gasket 66 is preferably provided between the surfaces 62 and 64 to ensure the vacuum seal. The rotary feed through 48 preferably comprises a commercially available differentially-pumped rotational mounting device also from Huntington Mechanical Laboratories of Mountain View, Calif., as series VF-174–275. The rotary feed through 48 comprises a first component portion 47 that is rotationally adjustable relative to a second component portion 49. Thus, the surface 64 of component 47 can rotate relative to a surface 68 of component 49. The above-identified rotary feed through 48 includes a 0–360 degree scale with a locking screw (not shown) to maintain alignment, and may optionally be provided with a stepper motor for automated rotation (series MVF-174–275, also commercially available from Huntington Labs.).

The component 47 of the rotary feed through 48 is connected to the cryogenic liquid vacuum feed through 46 by the bolts 60. At the opposite side of the rotary feed through 48 from the recessed surface 64, the surface 68 is sealingly engaged with a surface 70 of the mounting plate 50. Again, preferably a seal or gasket 72 is provided between the sealing surfaces 68 and 70 to provide a vacuum seal. The mounting plate 50 is fixed with the component 49 of the rotary feed through 48, such as by bolts (not shown).

As shown best in FIG. 7, the mounting plate 50 includes an opening 74 that is preferably slightly larger than the dimension of the nozzle 18. Mounting plate 50 also includes a pair of channels 76 which are used for adjustably mounting the mounting plate 50 to the sidewall 44 of the aerosol chamber 16. The channel 76 cooperate with a plurality, preferably 4, clamps 78 (only two of which are shown in FIG. 7) which are bolted to the sidewall 44. The clamps 78 overhang the side edges of the mounting plate 50 so as to act against the channels 76 so that when the clamps 78 are tightened in place, the mounting plate 50 is fixed in position. Preferably, the sidewall 44 of the aerosol chamber 16 is defined to have a channel 80 for guiding the mounting plate 50. The direction of the channel 80 is along the same direction as the nozzle 18 is to be translated to or away from the wafer 12 as indicated by arrow B shown in FIG. 5. Also extending in the same direction as the channel 80 is a slot 82 through which the nozzle 18 is positioned. As shown in FIG. 9, the nozzle 18 can be positioned anywhere along the length of the slot 82. The position of the nozzle 18 set by the clamps 78 acting against the mounting plate 50, as described above.

In order to provide a vacuum seal between the surface of channel 80 and the surface of mounting plate 50, a gasket 84 is provided. Preferably, the gasket 84 comprises an O-ring type sealing gasket which is fitted within a groove provided in the face of channel 80. The gasket 84 and its groove are illustrate in FIG. 9 as a substantially oval shape; however, any shape is usable so long as the slot 82 is surrounded and a vacuum seal is provided between the mounting plate 50 and the channel 80.

The slot 82 and the opening 74 through the mounting plate 50 are preferably configured so that a vacuum chamber 86 is provided within the interior of the cryogenic liquid vacuum feed through 46 and the rotary feed through 48 which is open to the inside of the aerosol chamber 16. That is, the pressure within the aerosol chamber 16 would be the same as the pressure within the interior chamber 86 defined within the rotational and translational connection assembly 42. The interior chamber 86 insulates the fitting 54 and the portions of the supply tube 52 and the nozzle 18 within the rotational and translational connection assembly 42. To insulate the remaining portion of the supply tube 52 that extends from the rotational and translational connection assembly 42, a vacuum jacket 88 is provided. The vacuum jacket 88 conventionally surrounds the supply tube 52 and is preferably connected by welding to the cryogenic liquid feed through 46. Thus, a separate vacuum can be provided within the interior of the vacuum jacket 88 to insulate the supply tube 52.

Rotational adjustment of the nozzle 18 is accomplished by the rotary position of the component 47 relative to the component 49 of the rotary feed through 48. To do this, the set screw (not shown) is loosened so that the components 47 and 49 can be relatively rotationally adjusted. The effect of moving component 47, while the component 49 is fixed in position to the mounting plate 50, is to also rotate the cryogenic liquid vacuum feed through 46 which is in turn fixed with the supply tube 52. Since supply tube 52 is fixedly connected with the nozzle 18 by the fitting 54, the nozzle 18 is ultimately rotationally adjusted corresponding to the scale provided on the rotary feed through 48. When the adjusted position is obtained, the set screw (not shown) is tightened. Furthermore, since the rotary feed through 48 is preferably vacuum tight, the rotary adjustment can be made while the aerosol chamber 16 is under vacuum.

By the above, it is also apparent that the mounting plate 50 can be adjusted in position within the channel 80 of the sidewall 44 of the aerosol chamber 16 to translatably position the nozzle 18 within the aerosol chamber 16. By loosening the clamps 78, the mounting plate 50 combined with the rotary feed through 48, the cryogenic liquid vacuum feed through 46, the supply tube 52, fitting 54 and nozzle 18 can be moved along the channel 80 and slot 82. The gasket 84 ensures a proper vacuum seal in any position along the slot 82, although vacuum may not be maintained during the actual adjustment process. When it is desired to fix the nozzle 18 in a desired translatable position, the clamps 78 are tightened to effect the proper seal of gasket 84 with the mounting plate 50 in the proper position. A scale may also be provided along the edge of the mounting plate 50 and/or the channel 80.

In accordance with another embodiment, the channel 80 and the slot 82 can instead be provided in the parallel direction of the surface of the wafer 12 (see FIG. 5). The nozzle can thus be movable along the surface of the wafer 12. To do this, a different vacuum interface technique than that described above would be needed, such as including a movable bellows, or the like. With this embodiment, it is possible to define the slot and channel to be of sufficient length so that the nozzle 18 can be moved over the entire surface of the wafer 12 or any portion thereof which is to be treated. Thus, with a stationary chuck for supporting the wafer in position within the aerosol chamber 16, the nozzle 18 can be moved for processing the wafer 12.

Figure 12:
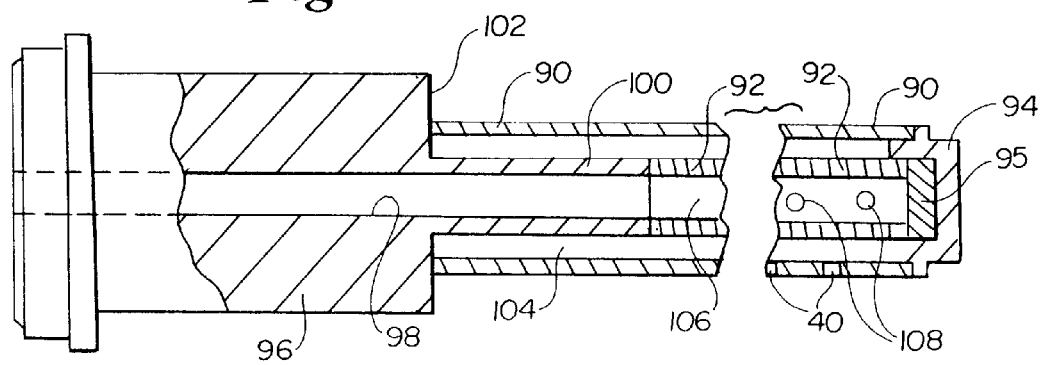

A construction of the nozzle 18, in accordance with the present invention, is illustrated in FIGS. 10, 11 and 12. Basically, the nozzle 18 comprises an outer tube 90, an inner tube 92, an end cap 94, an end cap 95 and a fitting 96 which preferably is a part of the VCR fitting 54 discussed above for connection with the supply tube 52.

As shown in FIG. 12, the fitting 96 includes an internal passage 98 that opens from the left side of the fitting 96, as illustrated, to communicate with the supply tube 52 via the fitting 54. At the other end of the fitting 96, a tube portion 100 is provided through which the passage 98 also passes. Surrounding the tube portion 100, the outer tube 90 is connected to the surface 102 of the fitting 96. Preferably, the outer tube 90 and the tube portion 100 are concentrically arranged. The outer tube 90 can be conventionally connected with surface 102 by welding. The inner tube 92 is preferably butted with and connected to the tube portion 100, such as by welding. At the other end of the nozzle 18, the end cap 95 is sealingly connected to the end of the inner tube 92 and is nested within the end cap 94 that seals the end of the outer tube 90 and supports both the inner and outer tubes 92 and 90, respectively. Preferably, end cap 94 maintains the concentric relationship of the outer tube 90 and inner tube 92.

By this construction, a first cavity 104 is defined within the outer tube 90 by its internal surface, the outer surface of the inner tube 92, the surface 102 of the fitting 96 and the end cap 94. A second internal cavity 106 is also defined within the outer tube 90, specifically within the inner tube 92 and the tube portion 100 of fitting 96 as defined by the interior surfaces thereof and the end cap 95.

The inner tube is preferably provided with a series of longitudinally aligned orifices 108. The orifices 108 need not be aligned, however, and in some cases may be purposefully misaligned. For example, some orifices 108 may be radially displaced by 180 degrees from others. The orifices 108 provide communication between the second internal cavity 106 and the first internal cavity 104. The jet impingement orifices 40 are provided in a longitudinally aligned series through the outer tube 90 to provide communication from the first internal cavity 104 and the outside. More specifically, the jet impingement orifices 40 direct the fluid/gas mixture therein toward the wafer 12, in the direction and angle of impingement α discussed above and shown in FIG. 6.

In accordance with the present invention, inner orifices 108 are not radially aligned with the jet impingement orifices 40. That is, they are radially angularly offset with respect to one another. Preferably, the inner orifices 108 are angularly offset from the jet impingement orifices 40 by 90°; however, it is only required that some angular displacement be provided to ensure the formation of at least one liquid pool within the nozzle 18, as will be discussed further below.

Figure 13:
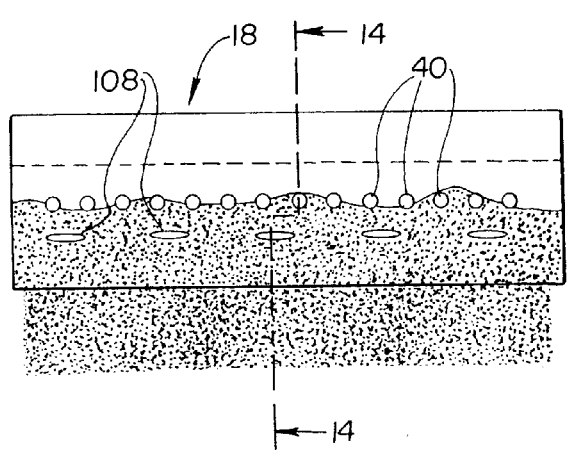
Figure 14:
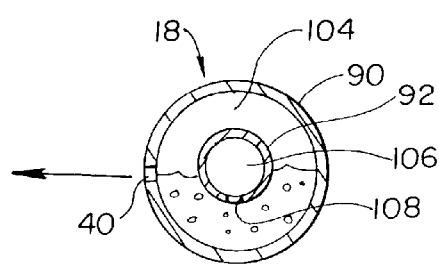

In FIGS. 13 and 14, one angular orientation of nozzle 18 is illustrated. Specifically, the inner tube 92 is oriented so that its orifices 108 are directed downward, which would be in the direction of gravity. The jet impingement orifices 42 of the outer tube 90 are angularly offset by 90° so that its aerosol stream is directed substantially horizontal. With reference to FIGS. 5 and 6, this would provide an aerosol stream substantially parallel to the surface of the wafer 12.

Figure 15:
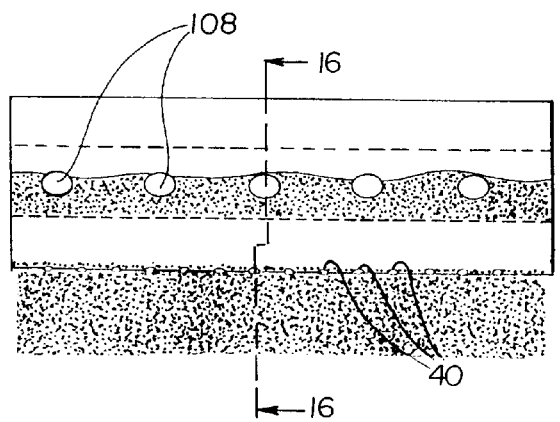
Figure 16:
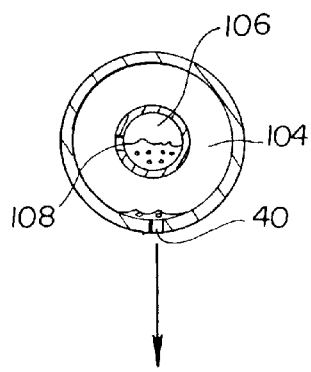

A second orientation is illustrated in FIGS. 15 and 16. In this case, the inner tube 92 is oriented so that its orifices 108 are directed at substantially 90° from the direction of gravity. The jet impingement orifices 40 of the outer tube 90 are directed generally in the direction of gravity. This orientation would provide an aerosol stream directed substantially perpendicularly to the wafer 12, as shown in FIGS. 5 and 6.

Figure 3:
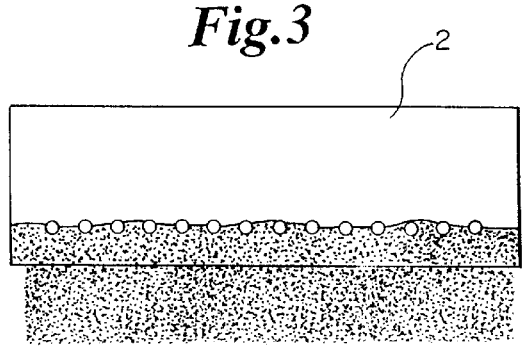
FIG. 3 is a schematic view of the nozzle of FIG. 2 oriented at the same angle and illustrating the formation of a liquid pool within the nozzle and along the longitudinal length thereof.
Figure 4:
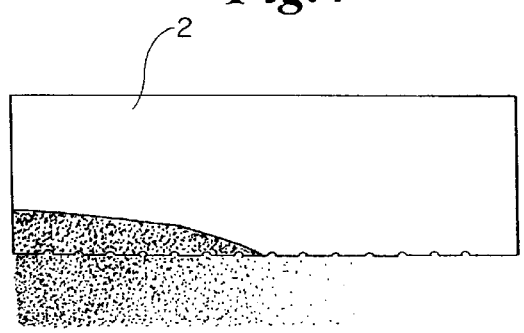
FIG. 4 is a schematic view similar to FIG. 3 but with the nozzle oriented so that its longitudinally aligned orifices produce an aerosol spray in the direction of gravity and illustrating a partial formation of a liquid pool.

As evidenced by both orientations, the formation of a liquid pool is ensured in one of the first internal cavity 104 or the second internal cavity 106 with a nozzle 18 at any angular orientation of the nozzle 18. Moreover, even at angular offsets between the inner orifices 108 and the jet impingement orifices 40 of other than 90°, some amount of liquid pooling will be provided for. This feature is beneficial in the dispensing of any type of liquid along a longitudinally arranged nozzle in that the liquid to be dispensed is distributed fully along the longitudinal length of the nozzle. As in the case of cryogenic aerosol cleaning, as discussed above in the Background section of this subject application, it is imperative that the liquid be distributed along the longitudinal length of the nozzle 18. In order to achieve the primary formation of the crystals by atomization of liquid droplets into small droplets in the subsequent freezing, the nozzle design provides for the distribution of the liquid along the length of the nozzle 18. As shown in FIG. 3, and discussed above, a liquid pool is created within the nozzle 2 with the jet impingement orifices provided at an angle from gravity. In comparison, as shown in FIG. 4, a liquid pool is not adequately created when the jet impingement nozzles are directed in the direction of gravity. In accordance with the present invention, no matter whether the jet impingement orifices 40 are directed at an angle from gravity (such as shown as 90° in FIG. 13) or in the direction of gravity (as shown in FIG. 15), an adequate liquid pooling is provided for.

By the present invention, a nozzle 18 is provided which can be translated so that the distance between the nozzle 18 and the surface of an object to be processed can be adjusted and wherein the angle of impingement of the aerosol stream can be rotationably adjusted. A specific embodiment of a mechanism to provide the rotational and translational connection and adjustment is described wherein the nozzle 18 can be set at any desired angular orientation. Moreover, in any angular orientation, a liquid pooling is ensured to provide for even distribution of liquid within the nozzle 18 and most importantly a more uniform jet impingement from the orifices 40. It is understood that other mechanisms to provide the rotatable and translatable adjustment can be used and that other orientations and configurations are possible to provide a first internal cavity and a second internal cavity that communicate in a way to ensure liquid pooling along the length of the nozzle 18.

In the case of a cryogenic aerosol cleaning apparatus, the jet impingement orifices 40 and the inner orifices 108 are aligned to extend longitudinally along the outer tube 90 and inner tube 92 respectively. The sizing of the jet impingement orifices 40 is determined on the basis of the formation of the liquid droplets that are atomized and frozen due to the pressure differential between the first internal cavity 104 and the inside of the aerosol chamber 16, which is provided at vacuum. However, it is preferable to maintain the pressures within the first internal cavity 104 and the second internal cavity 106 at substantially the same. To accomplish this, the cross-sectional area of the second internal cavity 106 should substantially equal the cumulative areas of the inner orifices 108. That is, by totaling the area of all of the inner orifices 108, that area should substantially equal the cross-sectional area of the second internal cavity 106. Preferably, the inner orifices 108 are substantially larger than the jet impingement orifices 40, and thus, substantially less inner orifices 108 are provided along the longitudinal length of the inner tube 92 as compared to the number of jet impingement orifices 40 along the outer tube 90.

The rotatable adjustment of the nozzle 18 permits the nozzle to be effectively used in a wider range of applications. The processing of substrates having deep trenches or other surface features may be more thoroughly accomplished by orienting the aerosol spray direction nearly perpendicular to the substrate surface. For a very flat surface, the orientation of the aerosol spray may be provided at a very shallow grazing angle to the substrate surface. Moreover, the intensity of the aerosol spray can be adjusted by the translation of the nozzle 18 to or away from the surface of the substrate to be processed. Most importantly, the angular orientation of the nozzle 18 and the space in between the nozzle 18 and the surface to be processed can each be independently adjusted while the uniformity of the spray along the longitudinal length of the nozzle 18 can be maintained.

Other modifications are contemplated within the scope of the present invention. With reference to FIG. 12, the outer tube 90 of the nozzle 18 can be adjustably connected to the fitting 96. The proximate end of the outer tube 90 can be provided with a flange, for example, that cooperates with a flange or clamp device provided on the surface 102 of the fitting 96 so that the outer tube 90 can be locked in any rotary adjusted position. The advantage of making the outer tube 90 adjustable is that the radial angular offset between the openings 108 and the jet impingement orifices can be optimized depending on the specific jet impingement angle that is determined for a particular treatment or processing application. In any case, it is preferable in accordance with the present invention that orifices 108 are radially provided in a way that allows the formation of a liquid pool in either the inner tube 92 or the outer tube 90, as above.

It is also contemplated that the supply tube can deliver the processing fluid or gas to the nozzle 18 anywhere along the length of the nozzle 18 or from more than one point. For example, if the supply line is connected between the ends of the nozzle 18, a rotational and translational connection assembly can still be used to mount the nozzle 18; however, the supply line can be connected with the inner tube 92 by appropriate fittings. The supply line can be flexible to permit the rotational and translational adjustments. With more than one supply point, a supply line 52, as above, can be combined with any other flexible supply line connected with the inner tube 92 anywhere along its length including at its distal end. Moreover, plural supply lines can be connected along the length of the nozzle 18. By the present invention, uniform distribution of liquid along the length of the nozzle 18 is accomplished regardless of where the supply of process fluid or gas is provided.

We claim:

1. An apparatus for treating the surface of an object by impinging the surface with an aerosol spray, said apparatus comprising:

an aerosol chamber defining an interior space for receiving an object to be treated within said aerosol chamber;

supporting means for operatively supporting the object within said aerosol chamber with a surface thereof in a position for treatment; and a nozzle for connection to a fluid supply and disbursement of an aerosol spray having a series of impingement orifices provided in a longitudinal direction along at least a part of said nozzle, said nozzle being operatively supported within said aerosol chamber by a rotationally adjustable nozzle support so that the series of impingement orifices can be set at different radial angles with respect to a longitudinal axis of said nozzle by rotation of said nozzle about said longitudinal axis, and wherein said nozzle has an interior longitudinally divided into first and second internal cavities with at least one opening between said first and second internal cavities, said opening between said first and second cavities being oriented at an offset radial angle with respect to the longitudinal axis that is different than the radial angle of said impingement orifices and being rotatable at this offset radial angle during a setting of the impingement orifices at a different radial angle.

2. The apparatus of claim 1, wherein said nozzle comprises an inner tube and an outer tube operatively supported and connected with respect to one another, said first internal cavity is provided between an inner surface of said outer tube and an outer surface of said inner tube, said second internal cavity is provided within said inner tube, and said opening extends through said inner tube.

3. The apparatus of claim 2, wherein said inner tube includes plural openings connecting said first and second internal cavities, said plural opening being longitudinally aligned.

4. The apparatus of claim 3, wherein said plural openings connecting said first and second internal cavities comprises a first set of plural openings that are longitudinally aligned and a second set of plural openings that are longitudinally aligned but at a different radial angle from the longitudinal axis than the radial angle of the first set of plural openings and the radial angle of said impingement orifices.

5. The apparatus of claim 2, wherein said inner tube includes plural openings connecting said first and second internal cavities, and the sum of the areas of said plural openings substantially equals the cross-sectional area of the second internal cavity.

6. The apparatus of claim 2, wherein said inner tube and said outer tube are circular in cross-section.

7. The apparatus of claim 6, wherein said inner tube and said outer tube are concentrically arranged.

8. The apparatus of claim 7, wherein the opening through said inner tube is offset by 90 degrees radially from the impingement orifices.

9. The apparatus of claim 2, wherein said second internal cavity is connected with a supply tube.

10. The apparatus of claim 2, further comprising a fitting to which both said outer tube and said inner tube are operatively connected with one another.

11. The apparatus of claim 10, wherein said outer tube is adjustably connected with said fitting so that a radial angle between the opening between said first and second cavities and the impingement orifices can be varied.

12. The apparatus of claim 1, wherein said nozzle is also adjustably mounted by said nozzle support to be positioned within said aerosol chamber so that a distance between said nozzle and a surface of an object to be treated when supported in position by said supporting means can be varied.

13. The apparatus of claim 12, wherein said nozzle support comprises a mounting plate to which said nozzle is rotationally adjustably mounted and which is adjustably mounted to a wall of said aerosol chamber for varying the distance between said nozzle and a surface of an object to be treated when supported in position by said supporting means.

14. The apparatus of claim 13, wherein said nozzle extends through a slot provided through said wall of said aerosol chamber so that said nozzle can be adjusted in position along the length of said slot by changing the position of said mounting plate relative to said wall of said aerosol chamber.

15. The apparatus of claim 12, further including a sealing means extending around said slot so that in any adjusted position of said nozzle, a sealing engagement can be provided between said mounting plate and said wall of said aerosol chamber.

16. An apparatus for treating the surface of an object by impinging the surface with an aerosol spray, said apparatus comprising:

an aerosol chamber defining an interior space for receiving an object to be treated within said aerosol chamber;

supporting means for operatively supporting the object within said aerosol chamber with a surface thereof in a position for treatment; and an elongate nozzle for disbursement of the aerosol spray having an inlet for connection to a fluid supply at a first end thereof and a series of impingement orifices provided longitudinally in the direction of fluid flow through the nozzle from its first end along at least a part of said nozzle, said nozzle being operatively supported at its first end by an adjustable nozzle support with the nozzle positioned within said aerosol chamber so that a distance between said nozzle and a surface of an object to be treated when supported in position by said supporting means can be varied and so that the series of impingement orifices can be set at different radial angles with respect to a longitudinal axis of said nozzle by rotation of said nozzle about said longitudinal axis, and wherein said nozzle has an interior longitudinally divided into first and second internal cavities with at least one opening between said first and second internal cavities, said opening between said first and second cavities being oriented at an offset radial angle with respect to the longitudinal axis that is different than the radial angle of said impingement orifices and being rotatable at this offset angle during a setting of the impingement orifices at a different radial angle.

17. The apparatus of claim 16, wherein said adjustable nozzle support comprises a mounting plate to which said nozzle is mounted and which is adjustably mounted to a wall of said aerosol chamber for varying the distance between said nozzle and a surface of an object to be treated when supported in position by said supporting means.

18. The apparatus of claim 17, wherein said nozzle extends through a slot provided through said wall of said aerosol chamber so that said nozzle can be adjusted in position along the length of said slot by changing the position of said mounting plate relative to said wall of said aerosol chamber.

19. The apparatus of claim 18, further including a sealing means extending around said slot so that in any adjusted position of said nozzle, a sealing engagement can be provided between said mounting plate and said wall of said aerosol chamber.

20. The apparatus of claim 16, wherein said nozzle is also rotationally supported by said adjustable nozzle support with the nozzle positioned within said aerosol chamber so that the series of impingement orifices can be set at different radial angles with respect to a longitudinal axis of said nozzle.

21. The apparatus of claim 20, wherein said nozzle has an interior longitudinally divided into first and second internal cavities with at least one opening between said first and second internal cavities, said opening between said first and second cavities being oriented at a different radial angle from the longitudinal axis than the radial angle of said impingement orifices.

22. The apparatus of claim 21, wherein said nozzle comprises an inner tube and an outer tube operatively supported and connected with respect to one another, said first internal cavity is provided between an inner surface of said outer tube and an outer surface of said inner tube, said second internal cavity is provided within said inner tube, and said opening extends through said inner tube.

23. The apparatus of claim 22, wherein said inner tube includes plural openings connecting said first and second internal cavities, said plural opening being longitudinally aligned.

24. The apparatus of claim 22, wherein said inner tube and said outer tube are circular in cross-section.

25. The apparatus of claim 24, wherein said inner tube and said outer tube are concentrically arranged.

26. The apparatus of claim 22, wherein said second internal cavity is connected with a supply tube.

27. The apparatus of claim 22, further comprising a fitting to which both said outer tube and said inner tube are operatively connected with one another.

28. The apparatus of claim 27, wherein said outer tube is adjustably connected with said fitting so that a radial angle between the opening between said first and second cavities and the impingement orifices can be varied.

29. A nozzle for use in an apparatus for the treatment of a surface of an object by impinging the surface with an aerosol spray, the apparatus having an aerosol chamber defining an interior space for receiving the object to be treated within the aerosol chamber, and a supporting means for operatively supporting the object within the aerosol chamber with a surface thereof in a position for treatment; said nozzle comprising:

an elongate inner tube;

an elongate outer tube;

a fitting operationally supporting and fixing said inner tube and said outer tube with respect to one another;

an inlet for connection to a fluid supply at a first end of said nozzle;

a series of impingement orifices provided longitudinally in the direction of fluid flow through said nozzle from its first end along at least a part of said nozzle; and means for rotationally adjustable mounting said first end of said nozzle to a wall of an aerosol chamber so that said series of impingement orifices can be set at different radial angles with respect to a longitudinal axis of said nozzle within an interior space of the aerosol chamber, wherein said nozzle has an interior longitudinally divided into first and second internal cavities with at least one opening between said first and second internal cavities, said first internal cavity being provided between an inner surface of said outer tube and an outer surface of said inner tube, said second internal cavity being provided within said inner tube, and said opening between said first and second cavities extending through said inner tube and being oriented at a different radial angle from the longitudinal axis than the radial angle of said impingement orifices, such that no portion of said opening is aligned with any portion of said impingement orifices while providing fluid communication between said first and second internal cavities.

30. The nozzle of claim 29, wherein said nozzle comprises an inner tube and an outer tube operatively supported and connected with respect to one another, said first internal cavity is provided between an inner surface of said outer tube and an outer surface of said inner tube, said second internal cavity is provided within said inner tube, and said openings extend through said inner tube.

31. The nozzle of claim 30, wherein said inner tube includes plural openings connecting said first and second internal cavities, said plural openings being longitudinally aligned.

32. The nozzle of claim 30, wherein said inner tube and said outer tube are circular in cross-section.

33. The nozzle of claim 32, wherein said inner tube and said outer tube are concentrically arranged.

34. The nozzle of claim 30, wherein said second internal cavity is connected with a supply tube.

35. The nozzle of claim 29, further including means for rotationally adjustably mounting the first end of said nozzle to a wall of the aerosol chamber so that the series of impingement orifices can be set at different radial angles with respect to a longitudinal axis of said nozzle within the interior space of the aerosol chamber.

36. The nozzle of claim 30, further comprising a fitting to which both said outer tube and said inner tube are operatively connected with one another.

37. The nozzle of claim 36, wherein said outer tube is adjustably connected with said fitting so that a radial angle between the opening between said first and second cavities and the impingement orifices can be varied.

* * * * *

UNITED STATES PATENT AND TRADEMARK OFFICE
CERTIFICATE OF CORRECTION

PATENT NO. : 5,942,037
DATED : August 24, 1999
INVENTOR(S) : THOMAS J. WAGENER ET AL.

It is certified that error appears in the above-identified patent and that said Letters Patent is hereby corrected as shown below:

Title page item [73],

The address of the Assignee, FSI International, Inc., is incorrectly stated as Chaska, Mich. The correct address is: Chaska, Minnesota.

Signed and Sealed this

Twenty-ninth Day of February, 2000

Attest:

Q. TODD DICKINSON

Attesting Officer

Commissioner of Patents and Trademarks